United States Patent [19]

Hasegawa et al.

[11] 4,216,484
[45] Aug. 5, 1980

[54] METHOD OF MANUFACTURING ELECTROLUMINESCENT COMPOUND SEMICONDUCTOR WAFER

[75] Inventors: Shinichi Hasegawa; Hisanori Fujita, both of Tsuchiura, Japan

[73] Assignee: Mitsubishi Monsanto Chemical Company, Tokyo, Japan

[21] Appl. No.: 904,116

[22] Filed: May 8, 1978

[30] Foreign Application Priority Data

May 6, 1977 [JP] Japan .................................. 52-51874

[51] Int. Cl.² ............................................. H01L 33/00
[52] U.S. Cl. ........................................ 357/17; 357/16; 357/61
[58] Field of Search ......................... 357/16, 17, 18, 61

[56] References Cited

U.S. PATENT DOCUMENTS

| | | | |
|---|---|---|---|
| 3,963,538 | 6/1976 | Broadie | 148/175 |
| 3,963,539 | 6/1976 | Kemlage | 148/175 |
| 4,117,504 | 9/1978 | Maslov | 357/16 |

*Primary Examiner*—Martin H. Edlow
*Attorney, Agent, or Firm*—Sughrue, Rothwell, Mion, Zinn and Macpeak

[57] ABSTRACT

A method of manufacturing an electroluminescent compound semiconductor wafer having epitaxial film layers each composed of a semiconductor containing components belonging to III and V groups of the periodic table one of which layers has the mixed crystal ratio of the components being constant comprises the step of at least reducing the supply of at least one of the III and V components at least once during the formation of the one layer.

35 Claims, 4 Drawing Figures

METHOD OF MANUFACTURING ELECTROLUMINESCENT COMPOUND SEMICONDUCTOR WAFER

BACKGROUND OF THE INVENTION

This invention relates generally to a method of manufacturing an electroluminescent compound semiconductor wafer, and, more particularly, to an improvement of a method of producing an epitaxial wafer having epitaxial layers each composed of a mixed crystal of two components including elements belonging to Groups III and V of the periodic table, respectively, from which and electroluminescent device may be produced.

Group III elements in the periodic table forming one of the components of the mixed crystal are, for instance, aluminum (Al), gallium (Ga), and indium (In). On the other hand, group V elements are, for instance, nitrogen (N), phosphorus (P), arsenic (As) and antimony (Sb). The mixed crystal of the III-V semiconductor materials in this invention has a composition defined as a "mixed crystal" or "solid solution" in crystallography. One component of the mixed crystal includes one kind of group III element and at least two kinds of group V elements, such as gallium arsenide phosphide ($GaAs_{(1-x)}P_x$, $0<x<1$), includes at least two kinds of group III elements and one kind of group V element such as gallium indium phosphide ($Ga_{1-y}In_yP$, $0<y<1$), or includes at least two kinds of group III elements and at least two kinds of group V elements such as gallium indium arsenide phosphide ($Ga_{(1-y)}In_yAs_{(1-x)}P_x$, $0<x<1$, $0<y<1$).

An epitaxially grown III-V semiconductor such as gallium arsenide phosphide ($GaAs_{1-x}P_x$, $0<x<1$) or gallium indium phosphide ($Ga_yIn_{1-y}P$, $0<y<1$) can be relatively freely changed in the peak light emission wavelength in the infrared and visible ranges by setting the mixed crystal ratio (x or y) to a suitable value. The epitaxially grown III-V semiconductors are extensively employed to manufacture light emitting diodes.

That is, the semiconductor wafer for diodes for red emission is obtained by epitaxially growing a $GaAs_{1-x}P_x$ layer on a GaAs monocrystal substrate with $x=0.40$, the semiconductor wafer for diodes for orange and yellow emissions are obtained by epitaxially growing a $GaAs_{1-x}P_x$ layer on GaP monocrystal substrates with $x=0.65$ and $X=0.85$, respectively, and the semiconductor wafer for diodes for green emission is obtained by epitaxially growing a GaP layer on a GaP monocrystal substrates. Alternatively it may be obtained by epitaxially growing a III-V mixed crystal on a monocrystalline substrate of Ge etc. which is a Group IV semiconductor.

As conducive to a full understanding of the above-described conventional epitaxial wafers, a description will be made in detail with reference to the accompanying drawing.

FIGS. 1 and 2 are a sectional view of an epitaxial wafer for red emission diodes, and an epitaxial wafer for yellow emission diodes, which are manufactured according to the conventional method. Referring to FIG. 1, reference character 10 designates a monocrystal substrate which may be a monocrystalline substrate of a Group III-V semiconductor such as gallium arsenide, gallium phosphite etc. or a monocrystalline substrate of IV semiconductor such as Si, Ge etc., the thickness of the substrate being in a range from 100 μm to 1000 μm and, preferably, in a range from 300 μm to 450 μm. In this example, the thickness is 300 μm.

An epitaxial $GaAs_{1-x}P_x$ region is made up of two layers 12 and 14. More specifically, the layer 12 is an epitaxial $GaAs_{1-x}P_x$ layer referred to herein as a transition layer whose mixed crystal ratio x is gradually increased from 0 to about 0.4, while the layer 14 is an epitaxial $GaAs_{1-x}P_x$ layer whose mixed crystal ratio x is constant, or about 0.40. On the other hand, referring to FIG. 2, reference character 20 designates a GaP monocrystal substrate, and an epitaxial region is made up of four layers 22, 24, 26 and 28. More specifically, the layer 22 is a GaP homoepitaxial layer, the layer 24 is a $GaAs_{1-x}P_x$ transition layer whose mixed crystal ratio x is gradually decreased from 1.0 to about 0.85, the layer 26 is a first $GaAs_{1-x}P_x$ constant layer whose mixed crystal ratio is constant, or about 0.85, and the layer 28 is a second $GaAs_{1-x}P_x$ constant layer whose mixed crystal ratio x is constant, or about 0.85. The layer 28 is similar to the layer 26, but has added with nitrogen (N) as an iso-electronic trap in order to improve the light emission efficiency.

With the epitaxial wafers for light emitting diodes manufactured according to the conventional epitaxial methods, the brightness values of the light emitting diodes manufactured from these epitaxial wafers are low in comparison with the theoritical value, and are therefor not always satisfactory as opto-electronic devices. Recent trends in the design of integrated circuits (IC or LSI) have been directed to the minimization of power consumption. This may be achieved by improving the light emission efficiency of epitaxially prepared diodes.

SUMMARY OF THE INVENTION

As a result of study, the present inventors have found that in the case of a mixed crystal epitaxial diode, the main reason for the low light emission efficiency is the existence of non-radiative centers which is caused by crystallographic defects occurring in the epitaxial wafer because of the fact that the substrate and the epitaxial layer are made of different materials having different lattice constants.

Accordingly, a primary object of this invention is to provide a novel method of epitaxial III-V semiconductor wafer suitable for manufacturing an electroluminescent device such as light emitting diodes capable of emitting light efficiently.

The foregoing object of the invention is achieved by a provision of a method in which, in an epitaxial growing process of a Group III-V semiconductor wafer having a desired constant mixed crystal ratio, the amount of supply of at least one of the Group III component and the Group V component forming the epitaxial layer is at least once reduced.

DETAILED DESCRIPTION OF THE PREFERRED EMBODIMENT

Figure 1:
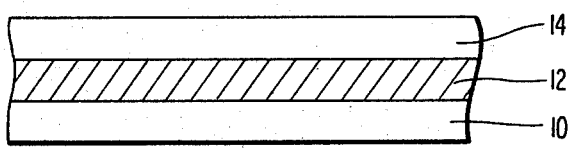
FIG. 1 is a sectional view showing an epitaxial $GaAs_{1-x}P_x$ manufactured according to a conventional method which was described already.
Figure 2:
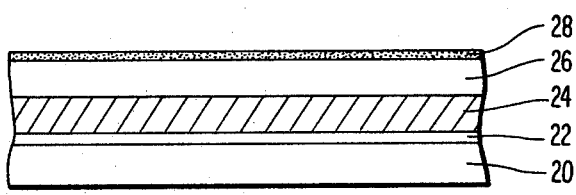
FIG. 2 is a sectional view showing an epitaxial $GaAs_{1-x}P_x$ wafer manufactured according to a conventional method which was described already.
Figure 3:
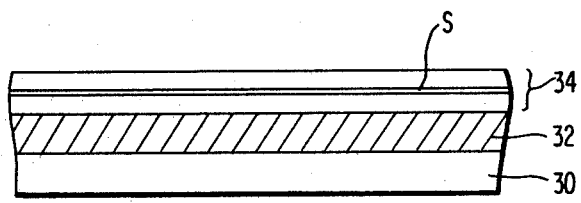
FIG. 3 is a sectional view showing an embodiment of an epitaxial $GaAs_{1-x}P_x$ wafer manufactured according to this invention.

Referring to FIG. 3, reference character 30 designates a GaAs substrate 300 μm thick, and an epitaxial GaAs$_{l-x}$P$_x$ is made up of a pair of layers 32 and 34. The layer 32 is a GaAs$_{l-x}$P$_x$ transition layer whose mixed crystal ratio x is gradually increased from 0 to 0.40, while the layer 34 is an epitaxial GaAs$_{l-x}$P$_x$ constant layer whose mixed crystal ratio x is constant, or about 0.04. The thickness of the layer 32 is made larger than 10 μn and preferably more than 30 μm. The thickness of the layer 34 is also preferably more than 10 μm although it is not critical. In this example, the thicknesses of the layer 32 and 34 are selected as 30 μm, respectively. Reference character S designates an interface or layer which is formed by at least reducing temporarily the supply of at least one of the components i.e. III component (gallium chloride formed by the reaction of hydrogen chloride and gallium) or V component (hydrogen arsenide and hydrogen phosphide) during the process of forming the constant layer 34.

Figure 4:
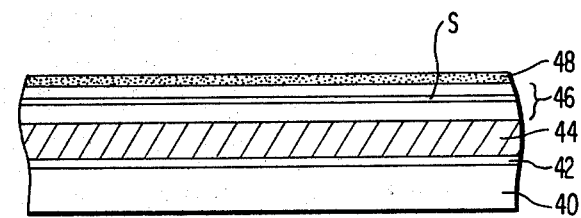
FIG. 4 is a sectional view showing another embodiment of an epitaxial wafer manufactured according to this invention.

Referring to FIG. 4, reference character 40 designates a GaP monocrystal layer 300 μm in thickness, and an epitaxial region is made up of four layers 42, 44, 46 and 48. More specifically, the layer 42 is a GaP homoepitaxial layer 10 μm in thickness, the layer 44 is a GaAs$_{l-x}$P$_x$ transition layer 30 μm in thickness whose mixed crystal ratio x is gradually decreased from 1.0 to 0.85, the layer 46 is a GaAs$_{l-x}$P$_x$ constant layer 40 μm in thickness whose mixed crystal ratio x is constant, and about 0.85, and the layer 48 is a second GaAs$_{l-x}$P$_x$ constant layer 20 μm whose mixed crystal ratio x is constant, and about 0.85, which is similar to the layer 46, but to which nitrogen (N) is added. Reference character S indicated in the first constant layer 46 designates an interface or layer which is formed by at least reducing temporarily the supply of at least one of III component (gallium chloride formed by the reaction of hydrogen chloride and gallium) and V component (hydrogen arsenide and hydrogen phosphide), during the process of forming the layer 46.

This invention has been developed on the basis of the finding that, as shown in FIGS. 3 and 4, the brightness of the light emissive diode is remarkably improved by providing the layer formed by at least reducing temporarily the supply of at least one of the Group III component and the Group V component forming the GaAs$_{l-x}$P$_2$ constant layer having a constant mixed crystal ratio. The reason for the remarkable improvement on the light emission efficiency of the wafer thus prepared is not always clear. However, the following consideration may apply.

In general, with the substrate and an epitaxial film formed on the substrate, various crystallographic defects may be created in the epitaxial film because of the differences in the amount of impurities added to the film and in the crystal lattice constant. The number of these various crystallographic defects thus created may tend to continuously and gradually decrease as the epitaxial film grows. In this invention, it is considered that, with respect to the number of various crystallographic defects the continuity of distribution of the crystallographic defects in the epitaxial layer is interrupted by reducing or interrupting temporarily the supply of at least one of the Group III and V components, as a result of which the crystal perfection of the epitaxial film itself may be markedly improved and electron-photon conversion efficiency is also improved, causing the light emission efficiency to be increased.

As conducive to a full understanding of the invention, examples thereof will be described.

EXAMPLE 1

A GaAs monocrystal substrate which is doped with silicone (Si) as an n-type impuritiy and has a carrier density of $6.8 \times 10^{17}$ atoms/cm$^2$ and whose crystallographic plane orientation is deviated by 2° from (100) towards <110< was provided. The thickness of the GaAs monocrystal substrate was about 350 μm at the beginning, but it was reduced to 305 μm through a degreasing process with an organic solvent and through a mechanical-chemical polishing process by which distortion of the substrate is removed.

The polished GaAs monocrystal substrate and a quartz boat containing high purity Ga were placed in predetermined positions in a horizontal type quartz epitaxial reactor 78 mm in inner diameter and 100 cm in length. Argon (Ar) was introduced into the epitaxial reactor to sufficiently replace the air therein. Then, a high purity hydrogen gas (H$_2$) was introduced thereinto as a carrier gas at 2000 cc/min., and the introduction of the argon gas was suspended, to start the temperature increasing process. After confirming that the quartz boat setting region and the substrate setting region were maintained at 750° C. and 810° C., respectively, an epitaxial run of GaAs$_{l-x}$P$_x$ film was started.

Upon start of the epitaxial growth, diethyl tellurim [(C$_2$H$_5$)$_2$Te] diluted to a concentration of 20 ppm by hydrogen (H$_2$) was introduced at a rate of 15 cc/min. On the other hand, a high purity hydrogen chloride gas (HCl) was introduced at a rate of 20 cc per minute to react with the gallium in the quartz board to obtain GaCl. On the other hand, during the initial 90 minutes, the flow rate of hydrogen arsenide (AsH$_3$) diluted to 12% in concentration by hydrogen (H$_2$) was gradually decreased from 283 cc/min. to 220 cc/min., while the flow rate of hydrogen phosphide (PH$_3$) diluted to 12% in concentration by hydrogen (H$_2$) was gradually increased from 0 cc/min. to 63 cc/min., so as to form a GaAs$_{l-x}$P$_x$ transition layer (32 in FIG. 3), and then formation of a GaAs$_{l-x}$P$_x$ constant layer (34 in FIG. 3) was effected.

Thereafter, the above-described (C$_2$H$_5$)$_2$Te, GaCl, AsH$_3$ and PH$_3$ were introduced at constant flow rates of 15 cc/min., 20 cc/min., 220 cc/min. and 63 cc/min. respectively, to form the GaAs$_{l-x}$P$_x$ constant layer (34 in FIG. 3), during 95 minutes except five minutes required for suspending the supply of the main component for the purpose of forming the intermediate region in the GaAs$_{1-x}$P$_x$ constant layer 34, that is, the layer S in the layer 34. Thus, the epitaxial run was ended.

A light emmitting diode was manufactured from the epitaxial wafer obtained by this epitaxial run, and the properties thereof were examined.

For comparison, the epitaxial runs according to the invention and epitaxial runs according to the conventional method in which the same epitaxial reactor was used were alternately carried out.

The data in the case where, according to this invention, the suspending time of supply is 5 minutes, and the main component to be suspended is the Group III component (the supply of HCl which reacts with Ga to form GaCl being suspended) are indicated in Table 1. The data in the case where the component to be suspended is the Group V components (the supply of AsH$_3$ and PH$_3$ being suspended) are indicated in Table 2. The data in the case where the components to be suspended are both of the Group III and V components (the supply of HCl, AsH$_3$ and PH$_3$ being suspended) are indicated in Table 3.

In addition, the data of the materials obtained by the conventional epitaxial run are also indicated in Tables 1, 2 and 3 for comparison.

Table 1

| Present method (The supply of the Group III component only, suspended) | | Conventional method | |
|---|---|---|---|
| Epitaxial Run No. | Brightness (Ft. L) of LED | Epitaxial Run No. | Brightness (Ft. L) of LED |
| No. 1 | 1440 | No. 2 | 700 |
| No. 3 | 1450 | No. 4 | 750 |
| No. 5 | 1470 | No. 6 | 790 |
| No. 7 | 1500 | No. 8 | 790 |
| No. 9 | 1430 | No. 10 | 670 |
| Average of five runs | 1458 | Average of five runs | 740 |

Table 2

| Present Method (The supply of the Group component only, suspended) | | Conventional Method | |
|---|---|---|---|
| Epitaxial Run No. | Brightness (Ft. L) of LED | Epitaxial Run No. | Brightness (Ft. L) of LED |
| 1 | 1400 | 2 | 605 |
| 3 | 1380 | 4 | 700 |
| 5 | 1440 | 6 | 720 |
| 7 | 1270 | 8 | 670 |
| 9 | 1370 | 10 | 800 |
| Average of five runs | 1372 | Average of five runs | 708 |

Table 3

| Present Method (The supplies of the Group III and V components, suspended) | | Conventional Method | |
|---|---|---|---|
| Epitaxial Run No. | Brightness (Ft. L) of LED | Epitaxial Run No. | Brightness (Ft. L) of LED |
| 1 | 1180 | 2 | 750 |
| 3 | 1240 | 4 | 710 |
| 5 | 1130 | 6 | 650 |
| 7 | 1190 | 8 | 790 |
| 9 | 1200 | 10 | 760 |
| Average of five runs | 1118 | Average of five runs | 732 |

Diodes were cut out from the epitaxial GaAs$_{1-x}$P$_x$ wafers according to this invention and according to the conventional method and their properties were examined by various measuring methods such as a chemical corrosion method (staining method), an X-ray diffraction method, a photoluminescence method, a capacity-voltage method (C-V method) and a Hall effect method. The results were as follows:

(a) The thickness of the GaAs$_{1-x}$P$_x$ transition layer was 30 μm±3 μm, and the thickness of the GaAs$_{1-x}$P$_x$ constant layer was 30 μm±2 μm. These layers of the epitaxial wafers were subjected to chemical corrosion (staining) with a HF-H$_2$O$_2$ mixture solution. With the GaAs$_{1-x}$P$_x$ epitaxial layer (the layer S in the layer 34 in FIG. 3) caused by suspending the main component supply during the epitaxial process was clearly observed as a chemical corrosion line (staining line) in the middle region of the constant layer, by means of a microscope.

(b) The mixed crystal ratio x in the GaAs$_{1-x}$P$_x$ constant layer was 0.39±0.01.

(c) The GaAs$_{1-x}$P$_x$ epitaxial film showed n-type conductivity, and the carrier density thereof was $(7\pm2)\times10^{16}$ atoms/cm$^2$.

The epitaxial GaAs$_{1-x}$P$_x$ wafers manufactured according to the present method and to the conventional method were subjected to a thermal diffusion with high purity zinc arsenide (ZnAs$_2$) for two hours at 750° C. to form p-n junctions. After the thermal diffusion, the rear surface of each wafer was polished, and ohmic electrodes were provided on both surfaces of the wafer. Furthermore, a series of assembling operations such as dicing and wire-bonding were given to each wafer, to provide a light emitting diode. From the light emitting diodes thus provided, twenty light emitting diodes were sampled at random for every epitaxial run. Then, under the conditions of the forward current density of 10 A/cm$^2$ and no epoxy resin coating the brightness of each light emitting diode thus sampled was measured. The mean value of the brightness of the twenty light emitting diodes was calculated and employed as the brightness value of that epitaxial run.

As is indicated in the above Tables 1 and 2, the brigtness of the diodes according to the present method is improved as much as about 90% when compared with that according to the conventional method. Furthermore, as is apparent from the above Table 3, the brightness of the diodes according to the method of this invention is improved as much as about 60% when compared with that according to the conventional method. Thus, the effect of this invention has been confirmed.

The above-described Example 1 relates to the manufacture of epitaxial GaAs$_{1-x}$P$_x$ wafers for red light emitting diodes. The conditions for manufacturing the wafers are that (1) the main component supply suspending time is set to five minutes, (2) the number of times of suspending the main component supply is only one during the formation of the constant layer and (3) the supply of the main component is suspended at the middle region in the GaAs$_{1-x}$P$_x$ constant layer (the layer 34 in FIG. 3). In this connection, the main component supply suspending time was varied in the range of from 1 minute to 30 minutes with respect to the condition (1), the number of times of suspending the supply was changed to two and three with respect to the condition (2), and the supply of the main component was suspended at a region other than the middle region in the GaAs$_{1-x}$P$_x$ composition constant layer 34, for instance, at a region at a distance corresponding to ⅓ of the thickness of the layer 34 from the surface thereof in the layer 34; however, substantially equivalent results were obtained.

EXAMPLE 2

A GaP monocrystal substrate which was doped with sulfur (S) as an n-type impurity and had a carrier density of 7.5×10$^{17}$ and whose crystallographc face direction deviated by 5° from (100) towards 110 was prepared. The initial thickness of the GaP monocrystal substrate was about 340 μm. It was thinned to 280 μm through a degreasing process with an organic solvent and through a mechanical-chemical polishing process in which any distortion thereof was removed.

Then, the polished GaP monocrystal substrate and a quartz boat containing high pruity Ga were placed in predetermined positions in a horizontal type quartz epitaxial reactor 78 mm in inner diameter and 100 cm in length. Argon (Ar) was introduced into the epitaxial reactor to sufficiently replace the air therein. Then, high purity hydrogen gas (H$_2$) was introduced as a carrier gas thereinto at 2000 cc/min, and the introduction of the argon gas was suspended, to start the temperature increasing process. After confirming that the quartz boat setting region and the substrate setting region were maintained at 750° C. and 870° C., respectively, an epitaxial run of GaAs$_{1-x}$P$_x$ was started.

Upon start of the epitaxy, hydrogen sulfide (H$_2$S) diluted to a concentration of 50 ppm by nitrogen gas was introduced at a rate of 17 cc/min. On the other hand, a high purity hydrogen chloride gas (HCl) was introduced to the gallium at a rate of 45 cc/min to obtain GaCl through the reaction with HCl and the gallium (Ga). On the other hand, during the initial 15 minutes, hydrogen phosphide diluted to a concentration of 12% by hydrogen (H$_2$) was introduced at a rate of 300 cc/min, so that the GaP layer (42 in FIG. 4) was obtained on the GaP monocrystal substrate through homoepitaxial growth. Thereafter, hydrogen arsenide (AsH$_3$) diluted to a concentration of 12% by PH$_3$ and H$_2$ was introduced to start heteroepitaxial growth of GaAs$_{1-x}$P$_x$. In other words, during the next 60 minutes while the flow rates of the H$_2$S and HCl were maintained at 17 cc/min and 45 cc/min, respectively, the flow rate of PH$_3$ was gradually decreased from 300 cc/min to 261 cc/min, and, on the other hand, the flow rate of AsH$_3$ was gradually increased from 0 cc/min to 39 cc/min, thereby to form the GaAs$_{1-x}$P$_x$ transition layer (44 in FIG. 4). Thereafter, formations of the first and second GaAs$_{1-x}$P$_x$ constant layers (46 and 48 in FIG. 4) were effected. More specifically, in the subsequent 95 minutes except five minutes required for suspending the supply of the main component for the purpose of forming the intermediate region in the first GaAs$_{1-x}$P$_x$ constant layer, that is, the layer S in the layer 46, i.e., during substantially 90 minutes, the flow rates of the above-described H$_2$S, HCl, PH$_3$ and AsH$_3$ were maintained at 17 cc/min, 45 cc/min, 261 cc/min and 39 cc/min, respectively, to form the first constant GaAs$_{1-x}$P$_x$ constant layer 46.

Furthermore, during 40 minutes after the 95 minutes, while the flow rates of the aforementioned H$_2$S, HCl, PH$_3$ and AsH$_3$ were maintained at 17 cc/min, 45 cc/min, 261 cc/min and 39 cc/min, respectively, high purity ammonia gas (NH$_3$) was introduced at 200 cc/min, to form the second GaAs$_{1-x}$P$_x$ constant layer 48 doped with nitrogen (N). Thus, the epitaxial run was completed.

A light emitting diode was manufactured from the epitaxial wafer obtained by this epitaxial run, and properties thereof were examined.

The data in the case where, according to this invention, the main component supply suspending time is 5 minutes, and the main component whose supply is suspended is a Group III component (the supply of HCl which reacts with Ga to form GaCl being suspended) are indicated in Table 4. The data in the case where the main component the supply of which is suspended is a Group V component (the supply of AsH$_3$ and PH$_3$ being suspended) are indicated in Table 5 and the data in the case where the main components the supply of which is suspended are both of the Group III component and the Group V component (the supply of HCl, AsH$_3$ and PH$_3$ being suspended) are indicated in Table 6 with data obtained from the diodes prepared according to the conventional runs which were carried out alternately.

Table 4

| Present Method (supply of Group III component only, suspended) | | Conventional Method | |
|---|---|---|---|
| Epitaxial Run No. | Brightness (Ft. L) of LED | Epitaxial Run No. | Brightness (Ft. L) of LED |
| 1 | 2550 | 2 | 1450 |
| 3 | 2800 | 4 | 1380 |
| 5 | 2650 | 6 | 1490 |
| 7 | 2700 | 8 | 1370 |
| Average of four runs | 2675 | Average of four runs | 1423 |

Table 5

| Present Method (supply of Group V component only, suspended) | | Conventional Method | |
|---|---|---|---|
| Epitaxial Run No. | Brightness (Ft. L) of LED | Epitaxial Run No. | Brightness (Ft. L) of LED |
| 1 | 3100 | 2 | 1400 |
| 3 | 3050 | 4 | 1390 |
| 5 | 2900 | 6 | 1500 |
| 7 | 2930 | 8 | 1440 |
| Average of four runs | 2995 | Average of four runs | 1433 |

Table 6

| Present Method (Supply of both Group III and V components, suspended) | | Conventional Method | |
|---|---|---|---|
| Epitaxial Run No. | Brightness (Ft. l) of LED | Epitaxial Run No. | Brightness (Ft. l) of LED |
| 1 | 1930 | 2 | 1490 |
| 3 | 2100 | 4 | 1510 |
| 5 | 1850 | 6 | 1480 |
| 7 | 1900 | 8 | 1390 |
| Average of four runs | 1945 | Average of four runs | 1468 |

Diodes were cut out from the epitaxial wafers according to this invention and the GaAs$_{1-x}$P$_x$ epitaxial wafers according to the conventional method and their properties were examined by a variety of measuring methods such as a chemical corrosion method (staining method), an X-ray diffraction method, a photoluminescence method, a low-temperature light absorption method, a capacity - voltage (C-V) method and a Hall effect method. The results were as follows:

(a) The thickness of the GaP homoepitaxial layer was 10±2 μm, the thickness of the GaAs$_{1-x}$P$_x$ transition layer was 35±4 μm, the thickness of the first GaAs$_{1-x}$P$_x$ constant layer was 45±4 μm, and the thickness of the second GaAs$_{1-x}$P$_x$ constant layer was 18±3 μm. The GaAs$_{1-x}$P$_x$ epitaxial wafers manufactured according to the present method were measured in accordance with the chemical corrosion method (staining method) with a HF-H$_2$O$_2$ mixture solution, as a result of which a line caused by suspending the main component supply during the epitaxial process was clearly observed as a chemical corrosion line (staining line) in the middle region of the first GaAs$_{1-x}$P$_x$ constant layer (46 in FIG. 4), by means of a microscope.

(b) The mixed crystal ratio x in the second GaAs$_{1-x}$P$_x$ constant layer was 0.85±0.01.

(c) The GaAs$_{1-x}$P$_x$ epitaxial layer showed n-type conductivity, the carrier density was $(8\pm2)\times10^{16}$ atoms/cm$^2$ and the nitrogen (N) density was $9\times10^{18}$ atoms/cm$^2$.

The GaAs$_{1-x}$P$_x$ epitaxial wafers manufactured according to the method of the invention and to the conventional method were subjected to thermal diffusin with a high purity zinc phospide (ZnP$_2$) for 150 minutes at 750° C. to form p-n junctions. Furthermore, as in the case of red light emitting diodes, a series of assembling operations were performed to obtain yellow light emitting diodes. From the light diodes thus obtained, twenty diodes were sampled at random for every epitaxial run. Then, under the conditions of a forward current density of 20 A/cm$^2$ and no epoxy resin coating, the brightness of each light emitting diode thus sampled was measured. The mean value of the brightness of the twenty diodes was calculated, and employed as the brightness value of that epitaxial run.

As is indicated in Table 4, the brightness of the light emitting diode manufactured according to the present method in which the supply of the group III component is suspended is improved as much as about 80% when compared with that of the light emitting diode manufactured according to the conventional method. As is clear from Table 5, the brightness of the diode manufactured according to the method of the invention in which the supply of the Group V component is suspended is improved as much as about 100% when compared with that of the light emitting diode according to the conventional method. Furthermore, as is apparent from Table 6, the brightness of the diode manufactured according to the present method in which the supply of both of the Group III and V components is suspended is improved as much as about 30% when compared with that of the light emitting diode according to the conventional method. Thus, as in the case of red light emitting diodes, the effect of this invention has been confirmed.

The above-described example 2 relates to the manufacture of epitaxial GaAs$_{1-x}$P$_x$ wafers for yellow light emitting diodes. The conditions for manufacturing the wafers are, that (1) the main component supply suspending time is set to five minutes, (2) the number of times of suspending the main component supply is only one during the epitaxy, and (3) the supply of the main component is suspended at the middle region in the first GaAs$_{1-x}$P$_x$ constant layer (46 in FIG. 4). In this connection, as in the case of epitaxial GaAs$_{1-x}$P$_x$ wafers for red light emitting diodes, the suspending time of the main component supply was varied in the range from 1 minute to 30 minutes with respect to the condition (1), the number of times of suspending the supply was changed to two and three with respect to the condition (2), and the supply of the main component was suspended at a region other than the middle region in the first GaAs$_{1-x}$P$_x$ constant layer 46, for instance, at a region at a distance corresponding to ⅓ of the thickness of the layer 46, however, substantially equivalent results were obtained.

Description hereinbelow is for the examples in which the supply of at least one of the Group III and V components is stopped temporarily during the formation of the constant layer 34 (FIG. 3) and 46 (FIG. 4).

Substantially the same effect can be obtained by merely reducing temperarily the supply of at least one of the semiconductor components, instead of the complete suspension of it. The degree of reduction of the semiconductor component supply may be less than 90% of the amount of supply required for obtaining the desired mixed crystal ratio. Preferably, the reduction of the supply amount of the Group III component or the group V component is 50% to 1% of the amount required for the formation of the layer 34 or 46. Where the number of the Group III and/or V elements is two or more, all the amounts of supply of the elements in the same group should be changed.

EXAMPLE 3

Experiment 1

A chemically polished gallium arsenide monocrystal substrate having a surface which is deviated by 2° in the direction [111] from the plane (100) was loaded in a horizontal type quartz epitaxial reactor having inner diameter 80 mm and length 100 cm. A quartz container filled with metallic gallium (Ga) was put in place in the reactor.

After the air in the reactor was replaced by argon (Ar), the temperature at sections of the epitaxial reactor where the substrate and the metallic gallium were placed were set to 810° C. and 790° C., respectively, and then epitaxial growth of a layer consisting of gallium arsenide phosphide having a mixed crystal ratio of 0.4 was started.

Upon start of the epitaxial growth of the layer, diethyltellurium [(C$_2$H$_5$)$_2$Te] diluted to a concentration of 20 ppm (by volume) with hydrogen gas was introduced at a flow rate of 20 cc/min.

Hydrogen chloride was introduced at a flow rate of 25 cc/min. to be reacted with the metallic gallium, and the resultant gallium chloride (GaCl) was supplied to the section of the reactor where the substrate was loaded. In order to form the transition layer 2, hydrogen gas containing arsine (AsH$_3$) 12% (volume ratio) was supplied at a flow rate of 280 cc/min. at the beginning, and the flow rate was gradually reduced to 220 cc/min. for 90 minutes thereafter. On the other hand, the amount of supply of hydrogen gas containing phosphine (PH$_3$) 12% was increased from 0 cc/min. to 60 cc/min. for 90 minutes.

Thereafter, for 40 minutes, hydrogen gas containing 10 ppm. diethyltellurium, hydrogen chloride, hydrogen gas containing 12% arsine, and hydrogen gas containing phosphine 12% were supplied respectively at the flow rates of 20 cc/min, 25 cc/min., 220 cc/min., and 60 cc/min., whereby a epitaxial layer of gallium arsenide phosphide having a mixed crystal ratio of 0.4 was formed. Thereafter, for 10 minutes, the amount of supply of hydrogen chloride only was reduced to 5 cc/min. to form the transition layer. Then, the amount of supply of hydrogen chloride was increased to 25 cc/min, and, for 60 minutes, the formation of the constant layer having a mixed crystal ratio 0.4 was effected. Thus, the reaction was ended.

In the epitaxial layers thus formed, the thickness of the transition layer (32 in FIG. 3) next to the substrate was 35 μm, the thickness of the first constant layer (lower portion of 34 in FIG. 3) was 14 μm, the thickness of the transition layer (S in FIG. 3) was 0.1 μm, and the thickness of the second constant layer (upper portion of 34 in FIG. 3) was 21 μm.

Experiments 2 through 5

In order to investigate the reproducibility of Experiment 1, vapor growth of an epitaxial film consisting of gallium arsenide phosphide (GaAs$_{0.6}$P$_{0.4}$) was repeated four times under the same conditions as those in Experiment 1.

EXAMPLE 4

Experiment 1

A chemically polished gallium phosphide monocrystal substrate having a surface which is deviated by 4° in the direction <100> from the plane (100) was loaded in an epitaxial reactor similar to that employed in Example 3. A quartz container filled with metallic gallium was put in place in the reactor.

After the air in the reactor was replaced by argon (Ar) gas, hydrogen gas was introduced at 2000 ml/min. and the supply of the argon gas was suspended. Thereafter, the temperature was increased, so that the sections of the reactors where the substrate and the metallic gallium were placed were set to 860° C. and 760° C., respectively. Then, an epitaxial growth of a layer consisting of gallium arsenide phosphide ($GaAs_{1-x}P_x$) having mixed crystal ratio of 0.86 was started.

That is, hydrogen gas containing hydrogen sulfide 50 ppm and hydrogen chloride were introduced into the reactor at 20 cc/min. and 40 cc/min., respectively. Furthermore, hydrogen gas containing phosphine 12% was supplied at 310 cc/min. for 15 minutes to form a homoepitaxial layer consisting of gallium phosphide. Thereafter, the amount of supply of the hydrogen gas containing phosphine was gradually reduced to 260 cc/min. from 310 cc/min. for 60 minutes, and the amount of supply of hydrogen gas containing arsine 12% was gradually increased to 40 cc/min. from 0 cc/min. to form a transition layer. After reaching the above-described values, the amount of supply of arsine and phosphine were maintained unchanged, and furthermore a formation of a constant layer was carried out for 40 minutes.

Then, the amount of supply of the hydrogen chloride was reduced to 4 cc/min to continue the reaction for 15 minutes, whereby a transition layer was formed. In 15 minutes, the amount of supply of the hydrogen chloride was restored to 40 cc/min. so as to grow a constant layer for 50 minutes. Furthermore, without changing the amounts of supply described above, ammonia ($NH_3$) was introduced into the reactor at 180 cc/min., and a nitrogen-doped layer was allowed to grow as an isoelectronic layer for 45 minutes. Thus, the reaction was ended.

In the epitaxial film obtained by this example, the thickness of gallium phosphide homoepitaxial layer (42 in FIG. 4), the transition layer (44 in FIG. 4), the constant layer (lower portion of 46 in FIG. 4), the transition layer (S in FIG. 4), the constant layer (upper portion of 46 in FIG. 4), and the nitrogen doped layer (48 in FIG. 4) were 11 µm, 34 µm, 30 µm, 0.11 µm, 34 µm and 20 µm, respectively. This was measured by using a chemical corrosion method.

Experiments 2 through 4

In order to investigate the reproducibility of the abovediscribed Experiment 1, the formation of an epitaxial layer consisting of gallium arsenide phosphide ($GaAs_{0.14}P_{0.86}$) was repeated three times, under the same conditions as those in Experiment 1.

COMPARISON EXAMPLE 3

Under the same conditions as those in Example 3, an epitaxial layer consisting of gallium arsenide phosphide ($GaAs_{0.6}P_{0.4}$) having no transition layer was formed. This experiment was repeated five times.

COMPARISON EXAMPLE 4

Under the same conditions as those in Example 3, an epitaxial layer consisting of gallium arsenide phosphide ($GaAs_{0.14}P_{0.86}$) having no transition layer was formed. This experiment was repeated four times.

The brightness of red light emitting diodes (peak wavelength being 660±10 nm) made of the epitaxial films manufactured as described in Example 3 and Comparison Example 3 is indicated in Table 7.

The brightness was measured with a current density of 10 A/cm$^2$.

The brightness of yellow light emitting diodes (peak wavelength being 590±10 nm) made of the epitaxial films manufactured as described in Example 4 and Comparison Example 4 is indicated in Table 8 below. The brightness was measured with a current density of 20 A/cm$^2$.

Table 7

| Example 3 | Brightness (Ft-L) | Comparison Example 3 | Brightness (Ft-L) |
|---|---|---|---|
| Experiment 1 | 1210 | Experiment 1 | 750 |
| Experiment 2 | 1230 | Experiment 2 | 730 |
| Experiment 3 | 1100 | Experiment 3 | 680 |
| Experiment 4 | 1250 | Experiment 4 | 850 |
| Experiment 5 | 1040 | Experiment 5 | 780 |

Table 8

| Example 4 | Brightness (Ft-L) | Comparison Example 4 | Brightness (Ft-L) |
|---|---|---|---|
| Experiment 1 | 2400 | Experiment 1 | 1560 |
| Experiment 2 | 2080 | Experiment 2 | 1610 |
| Experiment 3 | 2350 | Experiment 3 | 1440 |
| Experiment 4 | 2530 | Experiment 4 | 1430 |

It is obvious to those skilled in the art that, in addition to the above-described Examples, the technical concept of the invention can be applied to the manufacture of the following epitaxial wafers:

(1) Epitaxial GaAs wafers for infrared emission diodes and epitaxial $GaAs_{1-x}P_x$ (0<x<0.3) wafers for high-speed response infrared emission diodes, which may be formed on GaAs monocrystal substrates, and epitaxial $GaAs_{1-x}P_x$ wafers for orange emission diodes and epitaxial GaP wafers for green emission diodes, which are formed on GaP monocrystal substrates.

(2) Epitaxial GaAs wafers for infrared emission diodes, epitaxial $GaAs_{1-x}P_x$ wafers for high-speed response infrared emission diodes, epitaxial $GaAs_{1-x}P_x$ wafers for red emission diodes, and epitaxial $GaAs_{1-x}P_x$ wafers for orange emission diodes, which may be formed on Ge or Si monocrystal substrates.

(3) Epitaxial $Ga_yAl_{1-y}As$ (0<y<1) wafers for infrared emission diodes, red light emitting diodes and laser diodes, which may be formed on Ge or GaAs monocrystal substrates.

(4) Epitaxial $Ga_yIn_{1-y}P$ (0<y<1) wafers for red emission diodes, which are formed on GaP or InP monocrystal substrates.

(5) Epitaxial $Ga_yIn_{1-y}As_{1-x}P_x$ (0<y<1; 0<x<1) wafers for various light emission diodes, which may be formed on GaAs, GaP, InAs or InP monocrystal substrates.

What is claimed is:

1. An electroluminescent semiconductor wafer having a p-n junction and comprising a monocrystalline substrate, a first layer epitaxially formed on said substrate, said first layer being formed of a Group III-V mixed crystal compound semiconductor composed of a first component including at least one element belonging to Group III of the periodic table and a second component including at least one element belonging to Group V of the periodic table, the mixed crystal ratio of said first and second components being varied continuously, a second layer epitaxially formed on said first layer, said second layer being of a Group III-V mixed crystal compound semiconductor containing said first and second components, the mixed crystal ratio thereof being constant, and a transition layer formed in said second layer, at least one of said first and second components in said transition layer being at least once reduced in an amount of from 1% to 100% of the amount of the at least one of said first and second components needed to form said second layer.

2. An electroluminescent semiconductor wafer as set forth in claim 1, further comprising a third layer epitaxially formed on said second layer, said third layer being of the same compound semiconductor as that forming said second layer, said third layer being doped with iso-electronic trap material.

3. An electroluminescent semiconductor wafer having a p-n junction and comprising a monocrystalline substrate, a first layer epitaxially formed on said substrate, said first layer being formed of a Group III-V mixed crystal compound semiconductor composed of a first component including at least one element belonging to Group III of the periodic table and a second component including at least one element belonging to Group V of the periodic table, the mixed crystal ratio of said first and second components being constant, a second layer epitaxially formed on said first layer, said second layer being of the same compound semiconductor as that of said first layer, the mixed crystal ratio thereof beign varied continuously, a third layer epitaxially formed on said second layer, said third layer being composed of a third component including at least one element belonging to Group III of the periodic table and a fourth component including at least one element belonging to Group V of the periodic table, the mixed crystal ratio thereof being constant, and a transition layer formed in said third layer, said transition layer including a reduced amount of at least one of said third and fourth components in an amount of from 1% to 100% of the amount of the at least one of said third and fourth components needed to form said third layer.

4. An electroluminescent semiconductor wafer as set forth in claim 2, further comprising a fourth layer epitaxially formed on said third layer, said fourth layer being of the same compound semiconductors as that forming said second layer, said fourth layer being doped with an iso-electronic trap material.

5. An electroluminescent semiconductor wafer as set forth in claim 1, wherein said monocrystalline substrate is gallium arsenide.

6. An electroluminescent semiconductor wafer as set forth in claim 5, wherein said first and second layer are GaInAsP.

7. An electroluminescent semiconductor wafer as set forth in claim 5, wherein said first and second layer are GaAsP.

8. An electroluminescent semiconductor wafer as set forth in claim 5, wherein said first and second layer are GaAs.

9. An electroluminescent semiconductor wafer as set forth in claim 5, wherein said first and second layer are GaAlAs.

10. An electroluminescent semiconductor wafer as set forth in claim 1, wherein said monocrystalline substrate is gallium phosphide.

11. An electroluminescent semiconductor wafer as set forth in claim 10, wherein said first and second layer are GaInAsP.

12. An electroluminescent semiconductor wafer as set forth in claim 10, wherein said first and second layer are InP.

13. An electroluminescent semiconductor wafer as set forth in claim 10, wherein said first and second layer are GaAsP.

14. An electroluminescent semiconductor wafer as set forth in claim 1, wherein said monocrystalline substrate is germanium.

15. An electroluminescent semiconductor wafer as set forth in claim 14, wherein said first and second layer are gallium arsenide phosphide.

16. An electroluminescent semiconductor wafer as set forth in claim 14, wherein said first and second layer are GaAlAs.

17. An electroluminescent semiconductor wafer as set forth i claim 14, wherein said first and second layer are GaAs.

18. An electroluminescent semiconductor wafer as set forth in claim 1, whererin said monocrystalline substrate is Si.

19. An electroluminescent semiconductor wafer as set forth in claim 18, wherein said first and second layer are GaAs.

20. An electroluminescent semiconductor wafer as set forth in claim 18, wherein said first and second layer are GaAsP.

21. An electroluminescent semiconductor wafer as set forth in claim 1, wherein said monocrystalline substrate is InP.

22. An electroluminescent semiconductor wafer as set forth in claim 21, wherein said first and second layer are GaInAsP.

23. An electroluminescent semiconductor wafer as set forth in claim 1, wherein said monocrystalline substrate is InAs, and said first and second layer are GaInAsP.

24. An electroluminescent semiconductor wafer as set forth in claim 1, wherein the transition layer is formed by temporarily reducing the supply of the at least one of said first and second components of the amount required for the formation of the second layer during the manufacture thereof.

25. An electroluminescent semiconductor wafer as set forth in claim 1, wherein the transition layer is formed by temporarily stopping the supply of the at least one of said first and second components.

26. An electroluminescent semiconductor wafer as set forth in claim 24, wherein the supply of only one of said first and second component is reduced.

27. An electroluminescent semiconductor wafer as set forth in claim 25, wherein the supply of only one of said first and second components is stopped.

28. An electroluminescent semiconductor wafer as set forth in claim 3, wherein the transition layer is formed by temporarily reducing the supply of the at least one of said third and fourth components of the amount required for the formation of the third layer during the manufacture thereof.

29. An electroluminescent semiconductor wafer as set forth in claim 3, wherein the transition layer is formed by temporarily stopping the supply of the at least one of said third and fourth components.

30. An electroluminescent semiconductor wafer as set forth in claim 28, wherein the supply of only one of said third and fourth components is reduced.

31. An electroluminescent semiconductor wafer as set forth in claim 29, wherein the supply of only one of said first and second components is stopped.

32. An electroluminescent semiconductor wafer as set forth in claim 1, wherein said temporary reduction is 50% to 1% of the amount of at least one of said first and second components needed for the formation of said second layer.

33. An electroluminescent semiconductor wafer as set forth in claim 3, wherein said temporary reduction is 50% to 1% of the amount of at least one of said third and fourth components needed for the formation of said third layer.

34. An electroluminescent semiconductor wafer as set forth in claim 1, wherein for the mixed crystal ratio of said first and second components in said first layer the proportion of one component is increased gradually from 0 to a maximum value.

35. An electroluminescent semiconductor wafer as set forth in claim 3, wherein for the mixed crystal ratio of the compound semiconductor of said second layer the proportion of one component is increased gradually from 0 to a maximum value.

* * * * *